United States Patent
Hui et al.

(10) Patent No.: US 10,251,001 B2
(45) Date of Patent: Apr. 2, 2019

(54) INTEGRATED PERSONAL AMPLIFIER SYSTEM WITH HOWLING CONTROL

(71) Applicant: BITwave Pte Ltd, Singapore (SG)

(72) Inventors: Siew Kok Hui, Singapore (SG); Lei Tu, Singapore (SG)

(73) Assignee: BITWAVE PTE LTD, Singapore (SG)

( * ) Notice: Subject to any disclaimer, the term of this patent is extended or adjusted under 35 U.S.C. 154(b) by 16 days.

(21) Appl. No.: 15/351,742

(22) Filed: Nov. 15, 2016

(65) Prior Publication Data

US 2017/0201836 A1   Jul. 13, 2017

Related U.S. Application Data

(60) Provisional application No. 62/278,412, filed on Jan. 13, 2016.

(51) Int. Cl.
| | |
|---|---|
| *H04R 25/00* | (2006.01) |
| *G06F 3/16* | (2006.01) |
| *H03G 7/00* | (2006.01) |
| *H04R 3/02* | (2006.01) |

(52) U.S. Cl.
CPC ........... *H04R 25/453* (2013.01); *G06F 3/165* (2013.01); *H03G 7/002* (2013.01); *H04R 3/02* (2013.01); *H04R 25/558* (2013.01)

(58) Field of Classification Search
CPC combination set(s) only.
See application file for complete search history.

(56) References Cited

U.S. PATENT DOCUMENTS

| | | | |
|---|---|---|---|
| 4,088,835 A | 5/1978 | Thurmond et al. | |
| 5,822,726 A | 10/1998 | Taylor et al. | |
| 8,103,019 B1 | 1/2012 | Pandey et al. | |
| 2002/0052561 A1 | 5/2002 | Thornton | |

(Continued)

FOREIGN PATENT DOCUMENTS

| | | |
|---|---|---|
| EP | 1471765 A2 | 10/2004 |
| EP | 2677770 A1 | 12/2013 |

(Continued)

OTHER PUBLICATIONS

Extended European Search Report dated May 9, 2017 for European Patent Application No. 16184238.0, 23 pages.

(Continued)

*Primary Examiner* — Amir Etesam
(74) *Attorney, Agent, or Firm* — Amin, Turocy & Watson, LLP

(57) ABSTRACT

With regards to a hearing assistive device, a the user's speech can be picked up by the microphone and feed through the speaker causing an acoustic feedback effect. The user may have to constantly adjust the volume of the hearing assistive device to achieve a more comfortable volume based on where the speech is coming from. Furthermore, the when the hearing assistive device experiences feedback, the amplification of the feedback can cause damage to the user's hearing. Therefore, mitigating the acoustic feedback effect of assistive hearing devices can generate a more efficient and comfortable hearing device. The acoustic feedback can be mitigated by leveraging a dynamic range controller and a howling detector which comprises a user interface and a status indicator.

20 Claims, 6 Drawing Sheets

(56) References Cited

U.S. PATENT DOCUMENTS

| | | | |
|---|---|---|---|
| 2005/0111683 A1* | 5/2005 | Chabries | H03G 9/005 |
| | | | 381/317 |
| 2008/0235011 A1* | 9/2008 | Archibald | G10L 25/78 |
| | | | 704/225 |
| 2010/0004766 A1 | 1/2010 | Feng et al. | |
| 2010/0184488 A1* | 7/2010 | Takada | H04M 9/082 |
| | | | 455/570 |
| 2011/0019839 A1 | 1/2011 | Nandury | |
| 2015/0124998 A1 | 5/2015 | Siegel et al. | |
| 2016/0014532 A1* | 1/2016 | Nielsen | H04R 25/505 |
| | | | 381/60 |

FOREIGN PATENT DOCUMENTS

| | | |
|---|---|---|
| EP | 2736271 A1 | 5/2014 |
| JP | H08179794 A | 7/1996 |

OTHER PUBLICATIONS

Extended European Search Report dated May 19, 2017 for European Patent Application No. 16201887.3, 9 pages.

Partial European Search Report dated Feb. 3, 2017 for European Patent Application No. 16184238.0, 7 pages.

Office Action dated Nov. 1, 2017 for U.S. Appl. No. 15/097,011, 33 pages.

European Office Action dated Dec. 20, 2017 for European Application No. 16184238.0, 6 pages.

European Office Action dated Dec. 20, 2018 for European Application No. 16201887.3. 8 pages.

\* cited by examiner

INTEGRATED PERSONAL AMPLIFIER SYSTEM WITH HOWLING CONTROL

CROSS-REFERENCE TO RELATED APPLICATIONS

This Non-Provisional Patent Application claims priority to U.S. Provisional Patent Application No. 62/278,412, filed on Jan. 13, 2016, and entitled "INTEGRATED PERSONAL AMPLIFIER SYSTEM WITH HOWLING CONTROL". The entirety of the foregoing application is hereby incorporated by reference herein.

TECHNICAL FIELD

This disclosure relates generally to hearing assistive devices. More specifically, this disclosure relates to generating sound level control for hearing assistive devices.

BACKGROUND

A hearing aid is designed to amplify sound for a user, make speech more intelligible, and/or correct hearing impairments. Feedback, a howling caused by sound (particularly high frequency sound) leaking and being amplified again, may be a problem for severe hearing losses. In hearing aids, feedback arises when a part of the receiver signal captured by the hearing aid's microphone, gets amplified in the hearing aid and starts to loop through the system. When feedback occurs, it results in a disturbingly loud tonal signal. Feedback is more likely to occur when the hearing aid volume is increased, when the hearing aid fitting is not in its proper position or when the hearing aid is brought close to a reflecting surface (e.g., when using a mobile phone). Adaptive feedback cancellation algorithms are techniques that estimate the transmission path between loudspeaker and microphone(s). This estimate is then used to implement a neutralizing electronic feedback path that suppresses the tonal feedback signal.

A primary issue that can minimize the effectiveness of hearing aids is called the compression effect. The compression effect takes place when the amplification needed to make quiet sounds audible, if applied to loud sounds, damages the inner ear (cochlea). Louder sounds are therefore reduced giving a smaller audible volume range and hence inherent distortion. However, hearing protection can also be provided by an overall cap to the sound pressure and impulse noise suppression, which is available in some high-end hearing aids.

The above-described background relating to hearing aids is merely intended to provide a contextual overview of hearing aid technology, and is not intended to be exhaustive. Other context regarding hearing aids may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
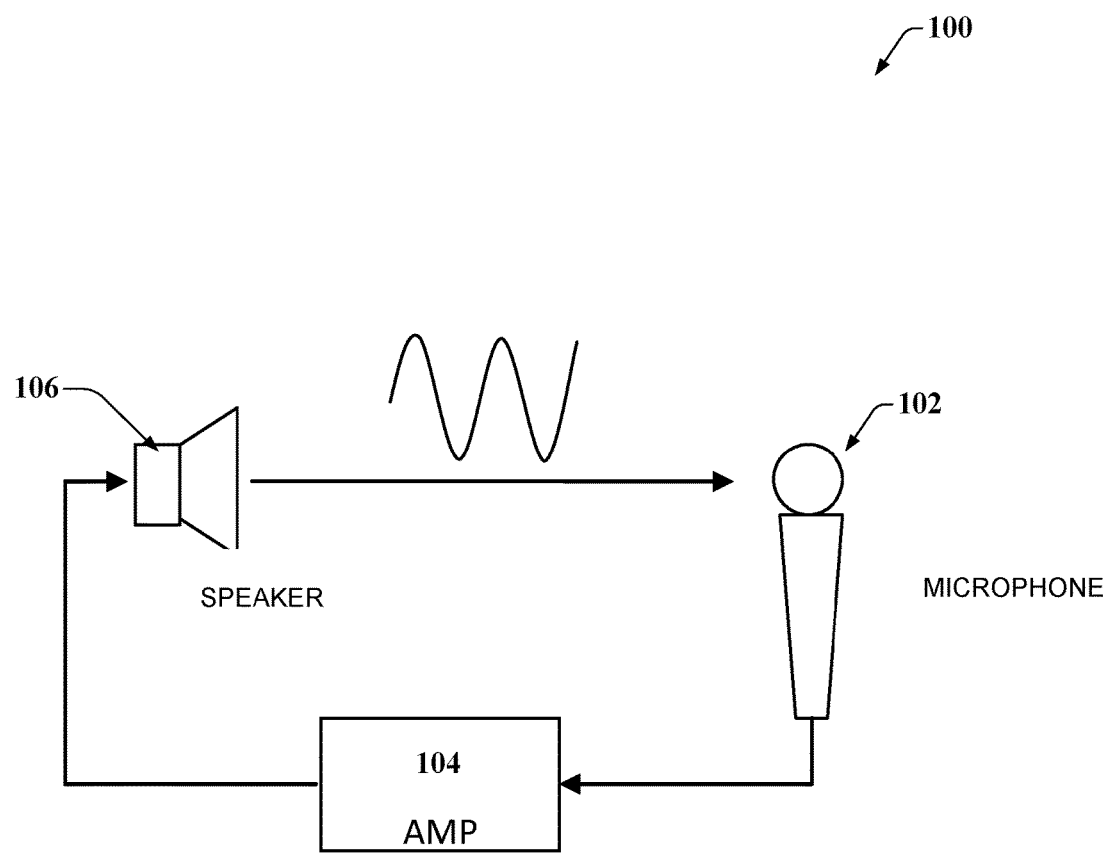
FIG. 1 illustrates an example schematic of an assistive hearing device.

In the following description, numerous specific details are set forth to provide a thorough understanding of various embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, these components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, a local area network, a wide area network, etc. with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. In an aspect, a component can emulate an electronic component via a virtual machine, e.g., within a cloud computing system.

The words "exemplary" and/or "demonstrative" are used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

In addition, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media.

As an overview of the various embodiments presented herein, to correct for the above identified deficiencies and other drawbacks of hearing aid devices, various embodiments are described herein to facilitate the reduction of feedback related to hearing aid device.

A simplified overview is provided herein to help enable a basic or general understanding of various aspects of exemplary, non-limiting embodiments that follow in the more detailed description and the accompanying drawings. This overview is not intended, however, as an extensive or exhaustive overview. Instead, the purpose of this overview is to present some concepts related to some exemplary non-limiting embodiments in simplified form as a prelude to more detailed descriptions of the various embodiments that follow in the disclosure.

Described herein are systems, methods, articles of manufacture, and other embodiments or implementations that can facilitate the use of hearing aid devices. A variety of hearing aid devices suffer from acoustic feedback. However, the embodiments of the hearing aid device presented herein provide several advantages such as a reduced acoustic feedback and user comfort.

The absolute amplitude or the strength of an acoustic signal such as speech can depend on the distance between the source and the microphone. In a hearing assistive device or a hearing aid device, a microphone can be close to a user's mouth, but the sound sources of interest can be far from the microphone. In a typical scenario, the distance between the sources and the microphone can range, during a typical conversation. When the distance between the sound source and the microphone is very far, the amplitude capture by the microphone is expected to be very small due to propagation loss of the sound energy. When the distance between the microphone and the sound source is very near, the amplitude of the speech signal captured by the microphone will be very large. In order for the sources and the user to communicate, the device can amplify a signal from the source to a level perceptible by the user. However, when it is the user's turn to talk, the signal captured by the device's microphone can be large due to the amplification. So the user can perceive his/her own voice to be very loud and will be very uncomfortable to his/her auditory system. However if the user set his/her microphone's sensitivity too low, then he/she can have problems hearing the far-end talker clearly. Therefore, the signal can be too loud for the user's ear and will cause discomfort to the user's auditory system.

A simple personal amplifier system can comprise a microphone, an amplifier, and one or more speakers. Whenever the aforementioned components are present, there is a potential for feedback. Feedback occurs when the sound from the speakers makes it back into the microphone and is re-amplified and sent through the speakers again. This loop happens so quickly that it can create its own frequency, which is heard as a howling sound. It should be noted that the howling sound is a perceived as an audible feedback. The howling sound can generally be a sinusoidal wave tone, and the distance between the microphone and the speakers can determine the frequency of the howling sound. The distance can control how quickly the sound can loop through the system. After repeatedly being amplified, the howling sound can be so loud that it irritates or damage a user's hearing. Moreover, when the amplification gain is high in a hearing aid device, the howling sound can be very common. Therefore, an efficient howling control system is desired to improve a user's hearing experience.

Existing howling control methods mainly focus on two aspects: (1) prevention of loop feedback from the speaker to the microphone; and (2) reduction of the amplification gain to avoid the positive feedback of the system when the howling sound occurs. Only reducing the amplification gain is not efficient even if the howling detection is adaptive because when the amplification gain is recovered to the normal value, the problem remains. Thus, when no howling sound is detected, the personal amplifier system should be reset to a normally working status. However, as long as the loop back from the speaker to the microphone exists, the howling sound will occur again when the amplification gain is recovered, creating residual feedback. Therefore, howling detection alone cannot be relied upon to mitigate the howling sound, and the user can be physically required to prevent the loop back from the speaker to the microphone.

A novel technique is proposed wherein the device can facilitate user interaction to increase efficiency of the device. For instance, the simple personal amplifier system mentioned above can also comprise a Dynamic Range Controller (DRC) and a howling detector. In some embodiments, the amplifier is followed by the DRC and the DRC is followed by the howling detector. It should be noted that any combination of these components can be appropriate to adjust the input and output signals of the system. The howling detector can estimate the probability of an occurrence of the howling sound, and in response to the estimation, alert a user of the hearing device via a status indicator. Furthermore, the howling detector can have preset ranges or thresholds of when to alert a user. For instance, certain users may be more sensitive to sound. Therefore, the user can preset the hearing device to have a lower threshold so that the user is alerted based on a lower threshold value than a user who is less sensitive to sound would use. Additionally, the DRC can constrain the output signal of the amplifier to a certain amplitude to limit the howling sound in effort to protect a user's hearing from damage. When the howling sound occurs and is detected by the howling detector, the howling detector can mute the speaker by setting the amplification gain to zero to protect the hearing of the user and provide a warning signal to the user via a status indicator. The warning signal can inform the user that the system is in a howling protection mode. The status indicator can be LED, audible tones, haptic feedback, etc. After the user realizes that the howling sound is occurring and the howling protection mode is activated, the can assess what the cause of the feedback is. For instance, the user may not have sealed the ear bud into the ear canal properly, or the speaker could be placed to close to the microphone. Once the user corrects the cause of the feedback, the user can reset the system to a normal working mode by interacting with a user interface of the system. The user interface could be attached to the system itself, or it could be remote to the system (e.g. a mobile phone).

Additionally, to increase accuracy of howling detection, a filter bank and a dynamic range controller (DRC) can be applied to a personal amplifier system. In each channel of the personal amplifier system, there can be a howling detector working independently, and once a howling sound is detected in any frequency band, the system can initiate a howling protection mode. In one non-limiting embodiment, the absolute amplitude of the signals captured by a microphone of a hearing assistive device or hearing aid device can be statistically analyzed. These signals can comprise a speech signal from multiple far-end talkers, environmental noise, and/or the user's own speech signals. The absolute amplitude level of the captured signals can be statistically analyzed and classified into classes. The absolute amplitude range for each class can be empirically estimated. For example, in a quiet environment, the amplitude of a very small signal can range from 100 to 1000 counts; the amplitude can range from 1000 to 5000 counts for a small signal; the amplitude of a medium signal can range from 5000 to 10000 counts; and for a large signal, the amplitude can range from 10000 to 20000 counts and for a very large signal, the amplitude can be more than 20000 counts. The count number can be based on or related to a 16 bit quantize.

As mentioned, the absolute amplitude of the microphone-captured signal can be statistically analyzed. An adaptive statistical signal processing technique can be developed. Briefly, for a 16 bit signal, the maximum amplitude can be 32768 counts. The maximum amplitude can be divided equally into 100 bins, so each bin will be 327.68 counts linearly increased to its maximum count of 32768. For example, the first bin can be sitting on 327.68 and the second bin can be sitting on 2*327.68=655.36, and so on. So if the sample has an amplitude of 491.52 (327.68+163.84) or less will be sorted into the first bin. If the sample has an amplitude larger than 491.52 but less than or equal to 819.2 (655.36+163.84), it will be sorted into this second bin, and so on and so forth.

Therefore, the probability density of each bin can be computed. The probability density for the bin for each of the four ranges in this case is compute recursively as follows. The bin that corresponds to the amplitude of the signal at time t is added a count a. The rest of the bins will be reduced by the quantity $P_m*(1-\alpha)$, where m is the bin number which ranges from 1 to M, where M is the total number of bins. $P_m$ is the probability density of bin m. This process is further illustrated by the equations below:

$$\text{Bin}=[B_1 B_2 B_3 \ldots B_M], \quad \text{Equation (1)}$$

wherein, the largest amplitude of a block can belong to bin $B_{13}$, in this case:

$$P_{m,t}=P_{m,t-1}*(1-\alpha), \quad \text{Equation (2)}$$

for m=1, 2, . . . M at time instant t $$P_{13,t}=P_{13,t-1}+\alpha, \quad \text{Equation (3)}$$

where $P_m$ is the probability density of bin m, and $P_{13}$ is probability density of bin 13. Whereas the bin number m ranges from 1, 2, 3 . . . M, excluding m=13 in this case, then $P_{13,t-1}$ is the probability density of bin $B_{13}$ at time frame t−1. Therefore, the sum of the probability of all the bins will be equal to one:

$$\Sigma_{m=1}^{M} P_{m,t}=1, \text{ where } m=1,2,3 \ldots M, \text{ at time frame } t. \quad \text{Equation (4)}$$

A probability table can also be formed from the bin data. The probability table can be updated continuously for efficacy, as the device perceives various signals, because the signal environment will keep changing as the user moves from one location to another or the acoustic environment changes. The time constant for updating the probability density table can be empirically determined.

The bin with the higher probability from 1000 to 10000 is taken to be the amplitude of the sources, e.g., the speech signal(s) from far-end talkers. The bin with the higher probability from 10000 up to 32768 is deemed to be the user speech. The bin with the highest probability below 1000 is likely to be noise amplitude.

A dynamic range controller can adaptively limit the captured signals absolute amplitude levels. The absolute amplitude level is the level derived from the probability density table. The bin with the highest probability in the range from 1000 to 10000 can be deemed to be the level for the far-end talkers. Therefore, the far-end signal amplitude will not be affected by the controller, whereas the near-end signal amplitude (e.g.: the user speech amplitude) is expected to be much larger than 10000 and can be limited by the DRC to the same amplitude as the far-end signal. Effectively, the loudness of the user's own voice will be the same as the far-end voice from the talkers, yielding a desirable end result.

In addition, in other non-limiting embodiments, an integrated personal amplifier system can comprise acoustic feedback control to significantly improve the hearing experience. As mentioned, in personal amplifier system, the acoustic feedback can occur when there is a loop back from the speaker to the microphone. Traditional feedback/howling control systems find it difficult to recover from feedback control mode to a normal working mode. In a proposed system, an interaction between the device and the user can ensure that the feedback control system is working more efficiently.

A dynamic range controller (DRC) can be employed after the amplifier. A feedback detector can be employed after the DRC. The howling detector can be operative to estimate the possibility of the occurrence of the howling sound, while the DRC can be operative to constrain the output signal of the amplifier to a certain amplitude to restrict the howling sound to a certain decibel level to protect a user's hearing from damage. When the howling sound occurs and is detected, the howling detector can mute the speaker by setting the amplification gain to zero to protect the user's hearing and provide a warning signal by a status indicator to inform the user the system is in a howling protection mode. The status indicator can be a light emitting diode (LED), an audible tone, a haptic feedback, etc. After the user realizes that the feedback is occurring and that the feedback protection mode is activated, the user can verify the cause of the loop back from the speaker to the microphone. For example, the user may not have sealed the earbud into the ear canal properly, or the speaker might be placed too close to the microphone. Once the user verifies the cause, the system can recover/revert to the normal working mode in response to a user interaction with the system.

In order to make the feedback detection more accurate and reliable, a filter bank can be applied to the personal amplifier system. In each channel of the filter, there can be a feedback detector working independently; and once feedback is detected in any frequency band, the system can go into the feedback protection mode.

According to an embodiment, described herein is an apparatus for facilitating feedback reduction. The apparatus can comprise a microphone that receives first acoustic signal data related to a first acoustic signal, and an amplifier that amplifies the first acoustic signal to an amplitude, resulting in an amplified first acoustic signal. The apparatus can also comprise a range controller that constrains the amplitude, resulting in a constrained amplitude. Furthermore, the apparatus can comprise an acoustic feedback detector that detects acoustic feedback signal data from the first acoustic signal data, wherein the acoustic feedback detector comprises a status indicator that indicates a status of the apparatus. Consequently, a speaker of the apparatus can output a second acoustic signal in accordance with the constrained amplitude.

According to another embodiment, described herein is a method for facilitating feedback reduction in assistive hearing devices. The method can comprise receiving, by a device comprising a processor, first acoustic signal data related to a first acoustic signal; and filtering, by the device, the first acoustic signal into a number of frequency bands. The method can also comprise amplifying, by the device, by the number of frequency bands, the first acoustic signal, resulting in an amplified signal. Thereafter, the amplified signal can be constrained by the device, resulting in a constrained amplified signal. Furthermore, the device can detect acoustic feedback signal data associated with an acoustic feedback signal, and output a second acoustic signal in accordance with the constrained amplified signal.

According to yet another embodiment, described herein is system for feedback reduction. The system can receive first acoustic signal data related to a first acoustic signal and filter the first acoustic signal into a number of frequency bands. The system can also amplify, by the number, the first acoustic signal, resulting in an amplified signal, and constrain the amplified signal, resulting in a constrained amplified signal. Furthermore, the system can detect acoustic feedback signal data associated with an acoustic feedback signal from the first acoustic signal data, and in response to the detecting the acoustic feedback signal data, the system can output a second acoustic signal in accordance with the constrained amplified signal.

These and other embodiments or implementations are described in more detail below with reference to the drawings.

FIGS. 1-6 illustrate apparatuses, systems, and methods that facilitate reduced acoustic feedback for hearing aid devices. For simplicity of explanation, the methods (or algorithms) are depicted and described as a series of acts. It is to be understood and appreciated that the various embodiments are not limited by the acts illustrated and/or by the order of acts. For example, acts can occur in various orders and/or concurrently, and with other acts not presented or described herein. Furthermore, not all illustrated acts may be required to implement the methods. In addition, the methods could alternatively be represented as a series of interrelated states via a state diagram or events. Additionally, the methods described hereafter are capable of being stored on an article of manufacture (e.g., a computer readable storage medium) to facilitate transporting and transferring such methodologies to computers. The term article of manufacture, as used herein, is intended to encompass a computer program accessible from any computer-readable device, carrier, or media, including a non-transitory computer readable storage medium.

Referring now to FIG. 1, illustrated is an example schematic of an assistive hearing device 100. The assistive hearing device 100, also known as a hearing aid can comprise a microphone 102, an amplifier 104 and one or more speakers 106. Whenever the aforementioned components are present, there is a potential for feedback. Feedback can occur when the sound from the speaker 106 makes it back into the microphone 102 and is re-amplified and sent through the speaker 106 again. This loop can happen quickly enough to produce its own frequency, which can be heard as a howling sound. The howling sound is generally a sinusoidal wave tone, and the distance between the microphone 102 and the speaker 106 can contribute to the frequency of the howling sound because that distance dictates how quickly the sound can propagate through the assistive hearing device 100. After amplified for so many times, the howling sound can be so loud that it irritates or damages a user's hearing. Moreover, the amplification gain can be high in a hearing aid device, and thus the howling sound is very common.

Figure 2:
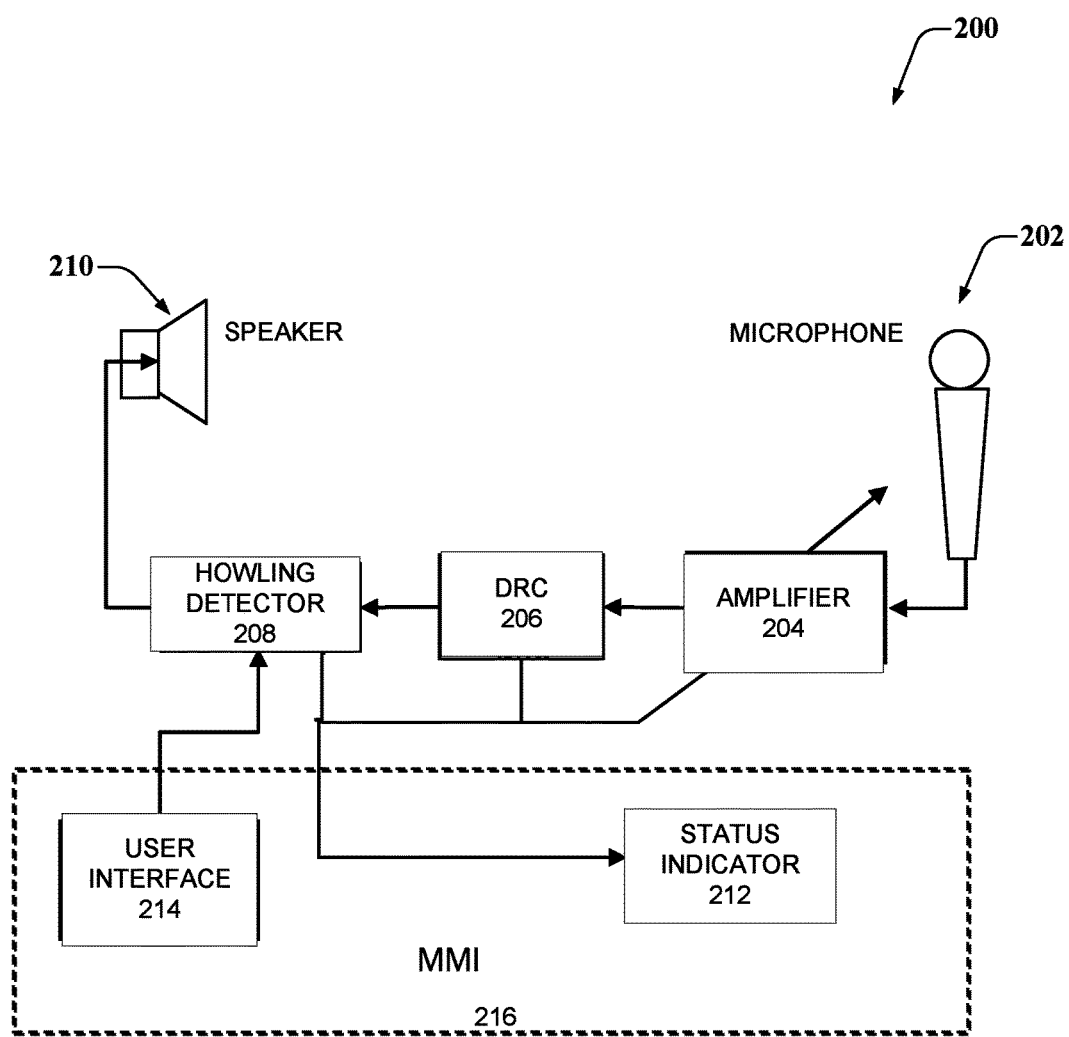
FIG. 2 illustrates an example schematic of an assistive hearing device comprising a howling control system.

Referring now to FIG. 2, illustrated is an example schematic of an assistive hearing device comprising a howling control system. The hearing device 200 can comprise a microphone 202, an amplifier 204, a DRC 206, a howling detector 208, and a speaker 210. The howling detector 208 can comprise a man-to-machine interface (MMI) 216 comprising a user interface 214 and a status indicator 212. The howling detector 208 can be employed after the DRC 206, and the DRC 206 can be employed after the amplifier 204. When the microphone 202 receives a sound signal, the amplifier 204 can amplify the sound signal. However, the DRC 206 can constrain the output signal of the amplifier 204 to a certain amplitude to restrict the howling sound to a certain decibel level to protect a user's hearing from damage. When the howling sound occurs and is detected by the howling detector 208, the howling detector 208 can mute the speaker 210 by setting an amplification gain to zero to protect the user's hearing.

Additionally, the howling detector 208 can also provide a warning signal via the status indicator 212 to inform the user that the hearing device 200 is in a howling protection mode. The status indicator 212 can be a light emitting diode (LED), audible tones, a display screen, etc. For example, once the howling detector 208 has detected feedback, the status indicator 212 could vibrate. In an alternative embodiment, the status indicator 212 could send a message to a mobile device associated with the hearing device 200, thereby alerting the user that there is an indication that the hearing device 200 is experiencing feedback. After the user realizes that the howling sound is occurring and the howling protection mode is activated, the user can verify a cause of the feedback from the speaker 210 to the microphone 202. For example, the user may not have sealed the ear bud into an ear canal properly, or the speaker 210 might be placed too close to the microphone 202. Once the user has mitigated the cause of the feedback from the speaker 210 to the microphone 202, the user can reset the system to a normal working mode by interacting with the user interface 214 of the MMI 216. It should be noted that the user interaction can be performed by pressing or depressing a button on the hearing device 200, and/or on a device (e.g., mobile device) external to the hearing device 200. In another embodiment, the user interface can comprise the ability of the hearing device 200 to accept an audible command from the user. The audible command can reset the hearing device 200 back to normal operation. During normal operation, the amplification gain is not set to zero and the hearing device 200 is not muted.

Figure 3:
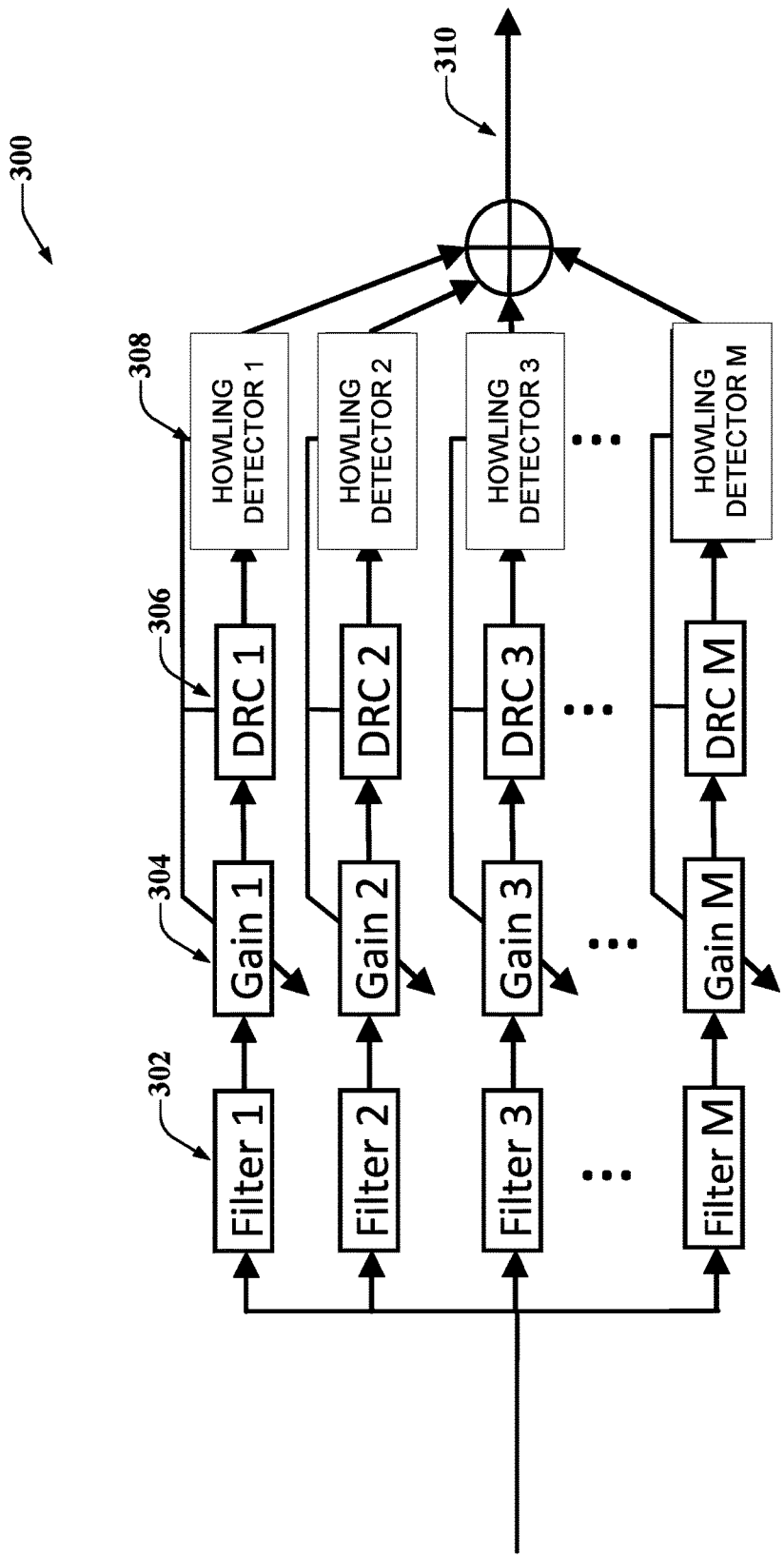
FIG. 3 illustrates an example schematic of a filter bank howling control system.

Referring now to FIG. 3, illustrated is an example schematic of a filter bank howling control system 300. The filter bank howling control system 300 can be leveraged for additional accuracy and flexibility when reducing the howling effect. The filter bank howling control system 300 can filter 302 the input signal into M different frequency bands in a simultaneous (or substantially simultaneous) or iterative process. Each channel can comprise an amplifier 304, a howling detector 308, and a DRC 306, which can all function separately. Since the howling sounds at different frequencies have different properties, it can be more accurate to detect their occurrence in different frequency bands. For instance, once a howling sound is detected in any frequency band, all of the amplification gains 304 such as Gain1, Gain2, ..., Gain M can be set to zero to mute the overall output signal 310. As noted above, the DRC 306 follows the amplifier 304, and the howling detector 308 can follow the DRC 306. When a sound signal is received at the filter 302, the sound signal can be amplified by the amplifier 404. However, if the filter bank control system 300 is experiencing feedback, then the DRC can constrain the signal to prevent damage to a user's hearing. Consequently, the howling detector 308 can mute the signal by setting the amplification gain to zero as indicated by FIG. 3. As noted above, the howling detector can also notify the user that the hearing device 200 has experienced feedback and prompt the user to interact with the hearing device via the user interface 214. When the frequency band where the howling sound occurs is muted, the howling sound can shift to other frequency bands. Therefore, in one embodiment, all the channels can be muted to prevent the howling sound from shifting to other frequency bands.

Figure 4:
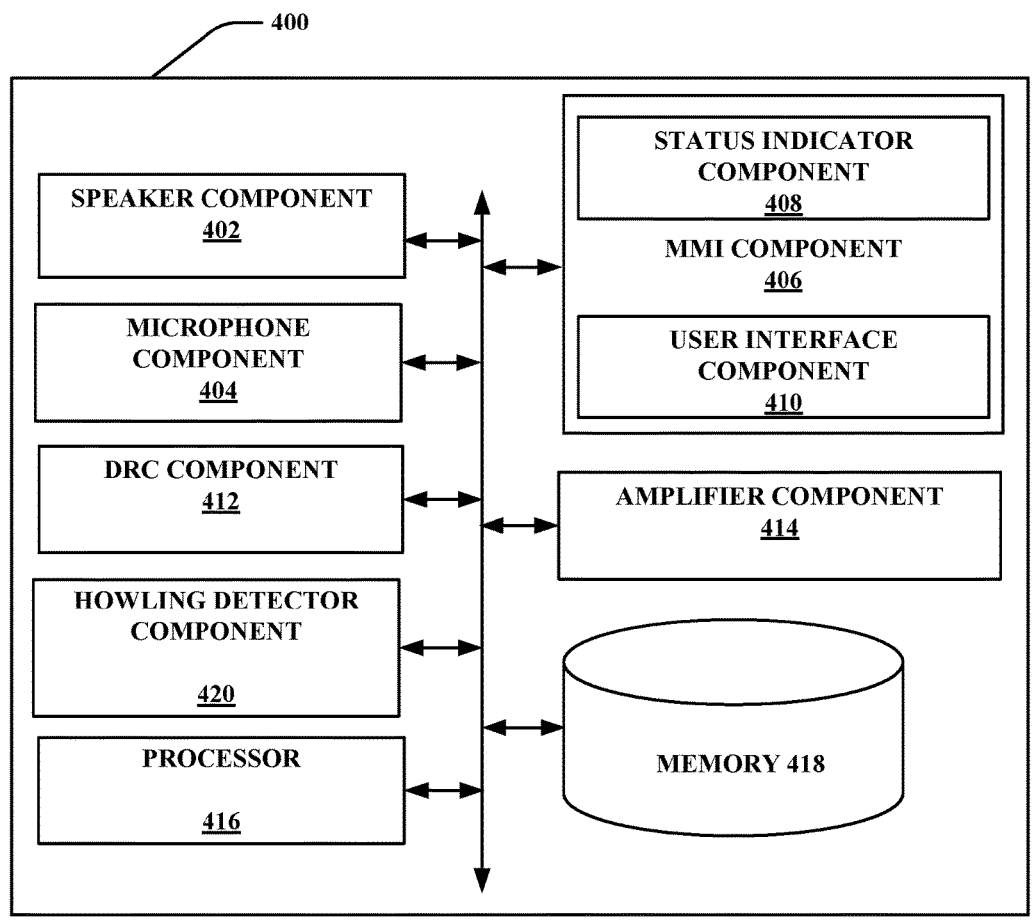
FIG. 4 illustrates an example schematic processing component of a hearing device.

Referring now to FIG. 4, illustrated is an example schematic processing component 400 of the hearing device. The processing component 400 can comprise a speaker component 402, a microphone component 404, MMI component 406, a DRC component 412, an amplifier component 414, a processing component 416, and a memory component 418. Furthermore, the MMI component 406 can comprise a status indicator component 408, and a user interface component 410.

The microphone component 404 can be operable to receive an acoustic audio signal and pass the audio signal to the amplifier component 414 to be amplified. Thereafter, the DRC component 412 can constrain the output signal of the amplifier component 414 to a certain amplitude to restrict the howling sound to a certain decibel level. The restricted howling sound can then be sent to the howling detector component 420. The howling detector component 420 can detect a howling or feedback noise above a certain level and mute the speaker by setting the amplification gain 304 to zero. The howling detector component 420 can also be communicatively coupled to the MMI component 406. The MMI component 406 can comprise the status indicator component 408 and the user interface component 410. In response to receiving a signal indicating that the amplification gain 304 has been muted, the MMI component 406 can signal the status indicator component 408 to indicate to the user that the processing component 400 has compensated for a howling sound. It should be noted that the indication to the user can take form in the place of an audible sound, haptic feedback, a message to a mobile device, etc. Consequently, the processing component 400 can await a user interaction via the user interface component 410 to reset the processing component 400. Resetting the processing component 400 can result in the amplification gain being set to a non-zero value and/or the hearing device filtering another channel.

Aspects of the processing component 400 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the processing component 400 can also include memory 418 that stores computer executable components and instructions. Furthermore, the processing component 400 can include a processor 416 to facilitate operation of the instructions (e.g., computer executable components and instructions) by the processing component 400.

Figure 5:
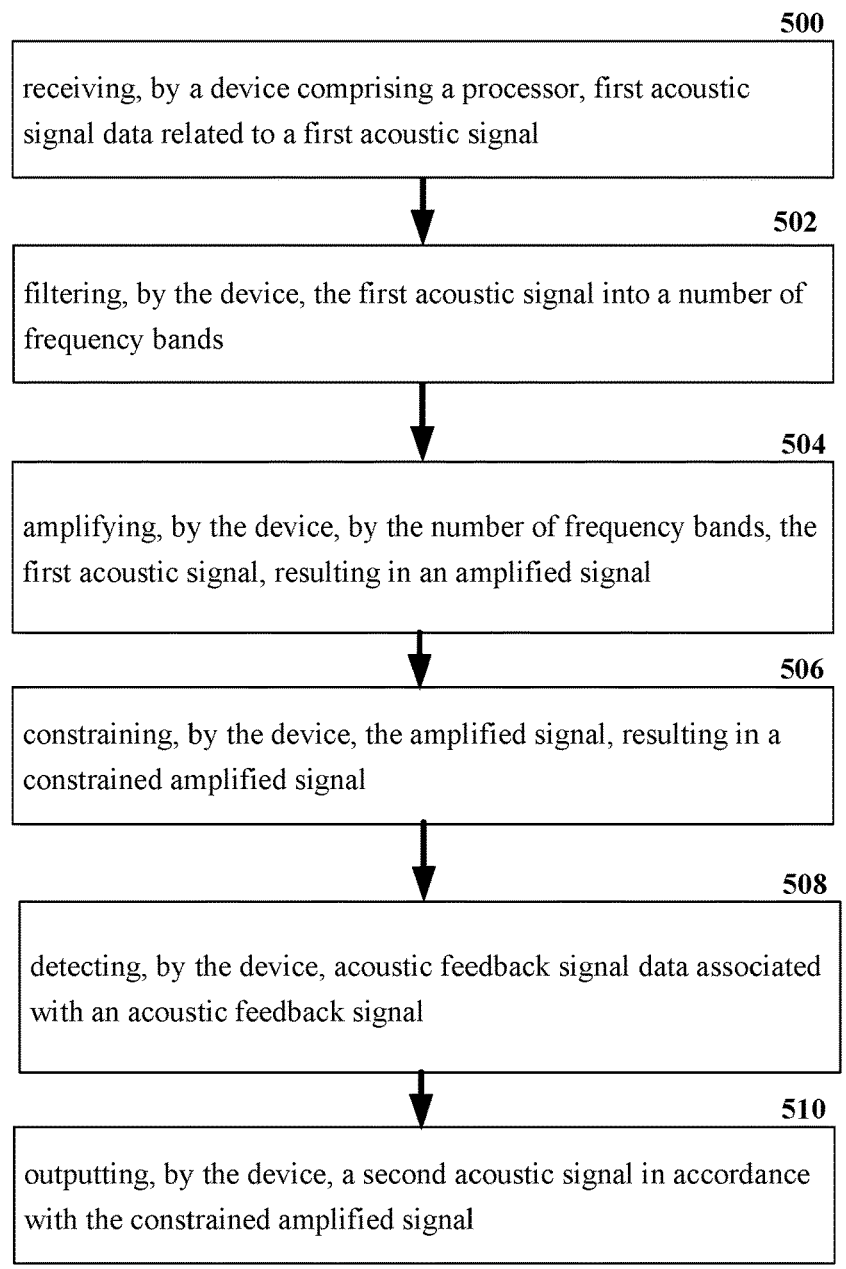
FIG. 5 illustrates an example schematic method block diagram for reducing acoustic feedback.

Referring now to FIG. 5, illustrated is an example schematic method block diagram for reducing acoustic feedback. At element 500 a device can receive first acoustic signal data related to a first acoustic signal (e.g., by the microphone component 404). The device can also filter the first acoustic signal into a number of frequency bands and amplify, by the number of frequency bands, the first acoustic signal, resulting in an amplified signal (e.g., by the amplifier component 414). Accordingly, to restrict the decibels of the acoustic signal, the device can constrain the amplified signal (e.g., by the DRC component 412), resulting in a constrained amplified signal. Furthermore, the device can detect acoustic feedback signal data associated with an acoustic feedback signal (e.g., by the howling detector component 420), and output a second acoustic signal in accordance with the constrained amplified signal (e.g., by the speaker component 402). The device can also alert the user (e.g., via the MMI component 406) that feedback has been detected and prompt the user (e.g., via the user interface component 410) to reset the system.

Figure 6:
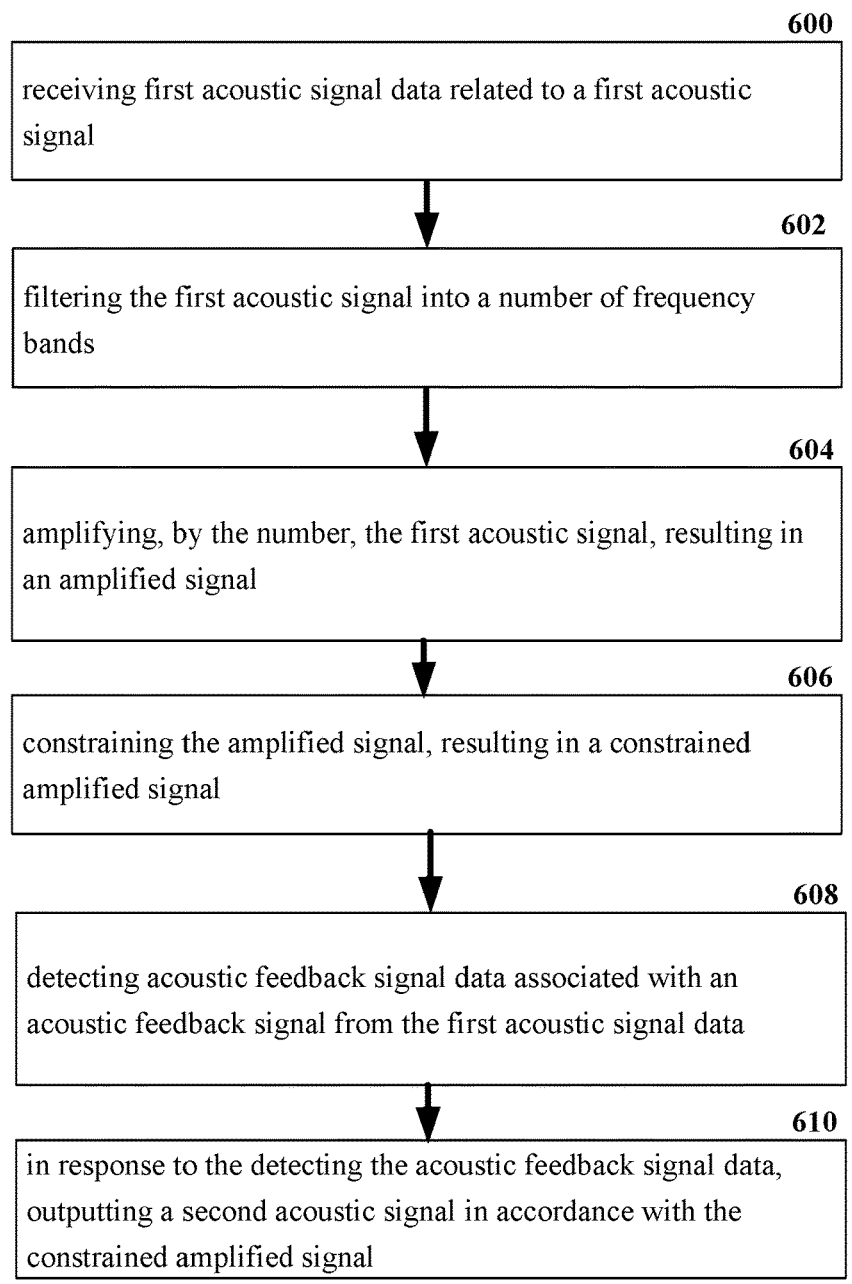
FIG. 6 illustrates an example schematic system block diagram for reducing acoustic feedback.

Referring now to FIG. 6, illustrated is an example schematic system block diagram for reducing acoustic feedback. At element 600 the system can receive first acoustic signal data related to a first acoustic signal (e.g., by the microphone component 404). The system can also filter the first acoustic signal into a number of frequency bands (e.g., by the filter 302) prior to amplifying, by the number, the first acoustic signal, resulting in an amplified signal (e.g., by the amplifier component 414). Thereafter, the system can constrain the amplified signal (e.g., by the DRC component 412), resulting in a constrained amplified signal. Additionally, the system can detect acoustic feedback signal data associated with an acoustic feedback signal from the first acoustic signal data (e.g., by the howling detector component 420), and in response to the detecting the acoustic feedback signal data, the system can output a second acoustic signal in accordance with the constrained amplified signal (e.g., by the speaker component 402). The device can also alert the user (e.g., via the MMI component 406) that feedback has been detected and prompt the user (e.g., via the user interface component 410) to reset the system.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding FIGs, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An apparatus, comprising:
 a microphone that receives first acoustic signal data related to a first acoustic signal;
 an amplifier that amplifies the first acoustic signal to an amplitude, resulting in an amplified first acoustic signal;
 a range controller that constrains the amplitude, resulting in a constrained amplitude, wherein the range controller further mutes an amplification gain associated with a first frequency band, resulting in a muted amplification gain;
 a filter bank that filters the first acoustic signal data to the first frequency band, resulting in a filtered first acoustic signal;
 an acoustic feedback detector that detects acoustic feedback signal data from the first acoustic signal data, wherein the acoustic feedback detector comprises a status indicator that indicates a status of the apparatus, and wherein the acoustic feedback detector shifts to a second frequency band in response to the amplification gain being determined to have attained the muted amplification gain; and
 a speaker that outputs a second acoustic signal in accordance with the constrained amplitude.

2. The apparatus of claim 1, wherein the acoustic feedback detector comprises a user interface that receives a user interaction that restricts an acoustic feedback.

3. The apparatus of claim 1, wherein the acoustic feedback detector comprises the filter bank that detects the acoustic feedback signal data associated with channels of the filter bank.

4. The apparatus of claim 1, wherein the range controller further controls the second acoustic signal in accordance with a maximum value determined to be associated with the first acoustic signal.

5. The apparatus of claim 1, wherein the range controller further constrains the amplitude of the second acoustic signal prior to a detection of the second acoustic signal by the acoustic feedback detector.

6. The apparatus of claim 1, wherein the range controller sets the amplification gain associated with the frequency band to zero.

7. A method, comprising:
 receiving, by a device comprising a processor, first acoustic signal data related to a first acoustic signal;
 filtering, by the device, the first acoustic signal into a first frequency band, resulting in a filtered first acoustic signal;
 amplifying, by the device, the filtered first acoustic signal, resulting in an amplified signal;
 constraining, by the device, the amplified signal, resulting in a constrained amplified signal, and wherein the constraining comprises muting an amplification gain associated with the first frequency band, resulting in a muted amplification gain;
 detecting, by the device, acoustic feedback signal data associated with an acoustic feedback signal;
 in response to the detecting, indicating, by the device, a status of the device;
 in response to the amplification gain reaching at least the muted amplification gain, shifting to a second frequency band; and
 outputting, by the device, a second acoustic signal in accordance with the constrained amplified signal.

8. The method of claim 7, wherein the constraining comprises constraining the first acoustic signal prior to the detecting the acoustic feedback signal data.

9. The method of claim 7, further comprising:
 estimating, by the device, an occurrence of acoustic feedback from acoustic signal samples.

10. The method of claim 9, further comprising:
 in response to the estimating, muting, by the device, a gain of a corresponding frequency band of the frequency bands.

11. The method of claim 10, wherein the muting the gain of the corresponding frequency band is based on a condition associated with the occurrence of the acoustic feedback being determined to have been satisfied.

12. The method of claim 7, further comprising:
 in response to detecting the acoustic feedback signal data, generating, by the device, warning signal data associated with a warning of the acoustic feedback.

13. The method of claim 12, further comprising:
 in response to the generating the warning signal data, requesting, by the device, a reset of the device via an interface component of the device.

14. A system, comprising:
 a processor; and
 a memory that stores executable instructions that, when executed by the processor, facilitate performance of operations, comprising:
  receiving first acoustic signal data related to a first acoustic signal;
  filtering the first acoustic signal into a first frequency band, resulting in a filtered first acoustic signal;
  amplifying, by the number, the filtered first acoustic signal, resulting in an amplified signal;
  constraining the amplified signal, resulting in a constrained amplified signal;
  muting an amplification gain associated with the first frequency band, resulting in a muted amplification gain;
  detecting acoustic feedback signal data associated with an acoustic feedback signal from the first acoustic signal data;

in response to the amplification gain being determined to be at least the muted amplification gain, shifting to a second frequency band, and in response to the shifting to the second frequency band, outputting a second acoustic signal in accordance with the constrained amplified signal.

15. The system of claim 14, wherein the operations further comprise:

estimating a probability associated with an occurrence of the acoustic feedback signal.

16. The system of claim 15, wherein the operations further comprise:

in response to the estimating, generating user notification data, and wherein the user notification data is associated with a warning of acoustic feedback.

17. The system of claim 15, wherein the operations further comprise:

in response to the estimating, muting acoustic feedback.

18. The system of claim 14, wherein the acoustic feedback signal data is associated with channels of a filter bank.

19. The system of claim 14, wherein the operations further comprise:

constraining an amplitude associated with the second acoustic signal.

20. The system of claim 19, wherein the constraining the amplitude associated with the second signal comprises constraining the amplitude prior to a detection of the second acoustic signal by an acoustic feedback detector.

\* \* \* \* \*